US012791608B2

(12) United States Patent
Ranganathan et al.

(10) Patent No.: US 12,791,608 B2
(45) **Date of Patent: *Nov. 10, 2026**

(54) MULTI-INPUT MULTI-ZONE THERMAL CONTROL FOR DEVICE TESTING

(71) Applicant: Advantest Test Solutions, Inc., San Jose, CA (US)

(72) Inventors: Karthik Ranganathan, Foothill Ranch, CA (US); Gregory Cruzan, Anaheim, CA (US); Paul Ferrari, Mission Viejo, CA (US); Samer Kabbani, Laguna Niguel, CA (US); Martin Fischer, Böblingen (DE)

(73) Assignee: Advantest Test Solutions, Inc., San Jose, CA (US)

( * ) Notice: Subject to any disclaimer, the term of this patent is extended or adjusted under 35 U.S.C. 154(b) by 138 days.

This patent is subject to a terminal disclaimer.

(21) Appl. No.: 18/972,124

(22) Filed: Dec. 6, 2024

(65) Prior Publication Data

US 2025/0102565 A1 Mar. 27, 2025

Related U.S. Application Data

(63) Continuation of application No. 18/201,076, filed on May 23, 2023, now Pat. No. 12,203,979, which is a continuation of application No. 18/076,253, filed on Dec. 6, 2022, now Pat. No. 11,852,678, which is a continuation of application No. 17/531,463, filed on Nov. 19, 2021, now Pat. No. 11,573,262.

(60) Provisional application No. 63/133,041, filed on Dec. 31, 2020.

(51) Int. Cl.
*G01R 31/28* (2006.01)
*G05B 15/02* (2006.01)

(52) U.S. Cl.
CPC ......... *G01R 31/2877* (2013.01); *G05B 15/02* (2013.01)

(58) Field of Classification Search
CPC .... G01R 31/2849–2855; G01R 31/2872–2877
USPC ..... 324/750.03–750.1, 750.28; 700/299–300
See application file for complete search history.

(56) References Cited

U.S. PATENT DOCUMENTS 6,825,681 B2 * 11/2004 Feder ................. G01R 31/2874 62/3.1
9,709,622 B2 * 7/2017 Lopez ................ G01R 31/2874

* cited by examiner

*Primary Examiner* — Alesa Allgood
*Assistant Examiner* — Rahul Maini

(57) ABSTRACT

Placing a first side of an active thermal interposer device of a thermal management head against a device under test (DUT). Disposing a cold plate against a second side of the active thermal interposer. The DUT includes a die and the active thermal interposer device includes a plurality of zones, each zone of the plurality of zones corresponding to a respective module of the plurality of modules and operable to be selectively heated. Receiving a respective set of inputs corresponding to each zone of the plurality of zones. Performing thermal management of the plurality of modules of the DUT by separately controlling temperature of each zone of the plurality of zones by controlling a supply of coolant to the cold plate, and individually controlling heating of each zone of the plurality of zones.

20 Claims, 12 Drawing Sheets

MULTI-INPUT MULTI-ZONE THERMAL CONTROL FOR DEVICE TESTING

RELATED APPLICATION(S)

This application is a Continuation Application of, and claims benefit of, co-pending, commonly owned U.S. patent application Ser. No. 18/201,076, filed May 23, 2023, entitled "Multi-Input Multi-Zone Thermal Control," to Ranganathan, et al., which is a Continuation application of commonly owned U.S. patent application Ser. No. 18/076,253, now U.S. Pat. No. 11,852,678, filed on Dec. 6, 2022, entitled "Multi-Input Multi-Zone Thermal Control," to Ranganathan, et al., which is a Continuation Application of commonly owned U.S. patent application Ser. No. 17/531,463, now U.S. Pat. No. 11,573,262, filed Nov. 19, 2021, entitled "Multi-Input Multi-Zone Thermal Control for Device Testing" to Ranganathan et al., which in turn claims priority to U.S. Provisional Application No. 63/133,041, filed Dec. 31, 2020, entitled, "Multi-Input Multi-Zone Thermal Control." This application is related to U.S. Pat. No. 9,291,667 entitled "Adaptive Thermal Control." All such applications are incorporated herein by reference in their entireties.

FIELD OF INVENTION

Embodiments of the present invention relate to the field of integrated circuit manufacturing and test. More specifically, embodiments of the present invention relate to systems and methods for thermal control of devices under test.

BACKGROUND

It is common to subject integrated circuits, either packaged or unpackaged, to environmental testing as an operation in a manufacturing processes. Typically in such testing, the integrated circuit devices are subject to electrical testing, e.g., "test patterns," to confirm functionality while being subjected to environmental stress. For example, an integrated circuit is heated and/or cooled to its specification limits while being electrically tested. In some cases, e.g., for qualification testing and/or "burn in," an integrated circuit may be stressed beyond its specifications, for example, to determine failure points and/or establish "guard band" on its environmental specifications.

Traditionally, such testing has included placing one or more integrated circuits and their associated test interface(s) and support hardware into an environmental chamber. The environmental chamber would heat and/or cool the integrated circuit(s) under test, known as or referred to as a device under test, or "DUT," as well as the test interface and support hardware, to the desired test temperature. Unfortunately, use of such test chambers has numerous drawbacks. For example, the limits and/or accuracy of such testing may be degraded due to environmental limits of the test interface circuits and/or devices. In addition, due to the large volumes of air and mass of mounting structures and interface devices required within an environmental test chamber, the environment inside such a test chamber may not be changed rapidly, limiting a rate of testing. Further, placing and removing DUTs and testing apparatus into and out of such test chambers further limits rates of testing, and requires complex and expensive mechanisms to perform such insertions and removals.

There are many ways to measure temperature of device(s) under test. Unfortunately, conventional control systems are limited in their use of such measurements.

SUMMARY OF THE INVENTION

Therefore, what is needed are systems and methods for multi-input multi-zone thermal control for devices in a testing environment. What is additionally needed are systems and methods for multi-input multi-zone thermal control for device testing operable to control different portions of a device under test to different temperatures. Further, there is a need for systems and methods for multi-input multi-zone thermal control for device testing operable to control different portions of a device under test at different heights to different temperatures based on different temperature inputs. There is a still further need for systems and methods for multi-input multi-zone thermal control for device testing that are compatible and complementary with existing systems and methods of testing integrated circuits.

Embodiments of the present invention are drawn to, in a tester system comprising a thermal management head and a test processor, a method of performing thermal management for an unpackaged integrated circuit device under test ("DUT"), the method comprising: disposing an active thermal interposer device adjacent to a cold plate of said thermal management head; disposing said DUT on said active thermal interposer device, wherein said DUT comprises a die and wherein said active thermal interposer device comprises a plurality of zones, each zone of said plurality of zones operable to be selectively heated; receiving a respective set of inputs, wherein at least one input of said set of inputs corresponds to a temperature of said die; testing said die using said test processor; concurrently with said testing, performing a thermal management process with respect to said die by: 1) controlling cooling to said cold plate; and 2) controlling heating of said plurality zones of said active thermal interposer device. Embodiments include the above and wherein said disposing said DUT on said active thermal interposer device comprises: automatically disposing said DUT on a surface of said active thermal interposer device; and automatically aligning a position of said DUT with respect to a location on said surface of said active thermal interposer device.

Embodiments include the above and wherein said performing said thermal management process comprises performing a plurality of thermal processes to control respective temperatures of said plurality of zones. Embodiments include the above and wherein said thermal management process is responsive to said set of inputs and wherein said set of inputs further comprise: an input corresponding to a temperature of said cold plate; an input corresponding to a junction temperature with respect to said die; and an input corresponding to an amount of power supplied to said die during said testing. Embodiments include the above and wherein said die comprises multiple functional units. Embodiments include the above and wherein said performing a thermal management process further comprises implementing power following heuristics within a respective thermal process, of said plurality of thermal processes, that utilizes inputs, of said set of inputs, pertaining to an amount of power supplied to said die during said testing thereof.

Embodiments include the above and wherein said performing a thermal management process further comprises implementing pre-trigger heuristics within a respective thermal process, of said plurality of thermal processes, that utilizes inputs, of said set of inputs, pertaining to amount of work expected to be performed by said die during said testing thereof. Embodiments include the above and wherein said active thermal interposer device is a discrete component and wherein further said plurality of zones of said active thermal interposer device are customized for a layout of said die.

Embodiments include, in a tester system comprising a thermal management head and a test processor, a method of testing an unpackaged integrated circuit device under test ("DUT"), the method comprising: disposing an active thermal interposer (ATI) onto a surface of a cold plate of said thermal management head, wherein a first surface of said ATI is adjacent to said surface of said cold plate and wherein said ATI comprises a plurality of zones operable to be selectively heated; disposing said DUT onto a second surface of said ATI, different from said first surface, and wherein said DUT comprises a die; and testing said DUT by said test processor; and concurrently with said testing, performing thermal management of said DUT based on a set of inputs, wherein said performing thermal management comprises: cooling said cold plate; and individually heating said plurality of zones of said ATI.

Embodiments include the above and wherein said set of inputs comprise: an input corresponding to a temperature of said cold plate; an input corresponding to a junction temperature with respect to said die; and an input corresponding to an amount of power supplied to said die during said testing. Embodiments include the above and wherein said die comprises multiple functional units. Embodiments include the above and wherein said performing thermal management further comprises implementing power following heuristics that utilize inputs, of said set of inputs, pertaining to an amount of power supplied to said die during said testing thereof. Embodiments include the above and wherein said performing thermal management further comprises implementing pre-trigger heuristics that utilize inputs, of said set of inputs, pertaining to amount of work expected to be performed by said die during said testing thereof. Embodiments include the above and wherein said ATI is a discrete component and wherein further said plurality of zones of said ATI are customized to a layout of said die.

Embodiments include a test system for testing integrated circuits, said test system comprising: a thermal management head comprising a cold plate; a test computer operable to perform testing on an unpackaged integrated circuit device under test ("DUT"); an automated pick and place system operable to: dispose an active thermal interposer (ATI) onto a surface of said cold plate of said thermal management head, wherein a first surface of said ATI is disposed adjacent to said surface of said cold plate, and wherein said ATI comprises a plurality of zones operable to be selectively heated; and dispose said DUT onto a second surface of said ATI, different from said first surface, and wherein said DUT comprises a die; and wherein said thermal management head further comprises components for performing thermal management of said DUT concurrently with said testing and based on a set of inputs, wherein said performing thermal management comprises: cooling said cold plate; and individually heating said plurality of zones of said ATI.

Embodiments include the above and wherein said set of inputs comprise: an input corresponding to a temperature of said cold plate; an input corresponding to a junction temperature with respect to said die; and an input corresponding to an amount of power supplied to said die during said testing. Embodiments include the above and wherein said die comprises multiple functional units. Embodiments include the above and wherein said performing thermal management further comprises implementing power following heuristics that utilize inputs, of said set of inputs, pertaining to an amount of power supplied to said die during said testing thereof.

Embodiments include the above and wherein said performing thermal management further comprises implementing pre-trigger heuristics that utilize inputs, of said set of inputs, pertaining to amount of work expected to be performed by said die during said testing thereof. Embodiments include the above and wherein said ATI is a discrete component and wherein further said plurality of zones of said ATI are customized to a layout of said die.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

Figure 1A:
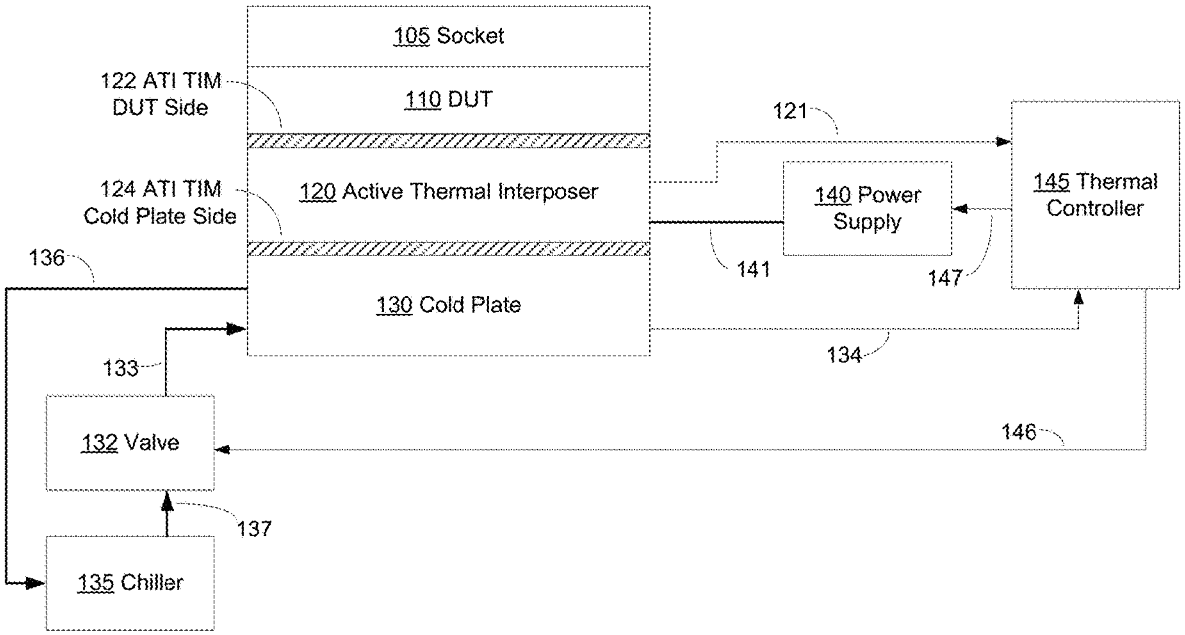
FIG. 1A illustrates an exemplary block diagram of elements of an automated test system environment that may serve as a platform for embodiments in accordance with the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow (e.g., methods 600, 900) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as “disposing” or “receiving” or “performing” or “testing” or “heating” or “cooling” or “maintaining temperature” or “bringing” or “capturing” or “storing” or “reading” or “analyzing” or “generating” or “resolving” or “accepting” or “selecting” or “determining” or “displaying” or “presenting” or “computing” or “sending” or “receiving” or “reducing” or “detecting” or “setting” or “accessing” or “placing” or “forming” or “mounting” or “removing” or “ceasing” or “stopping” or “coating” or “processing” or “generating” or “adjusting” or “creating” or “executing” or “continuing” or “indexing” or “translating” or “calculating” or “measuring” or “gathering” or “running” or the like, refer to the action and processes of, or under the control of, a computer system, or similar electronic computing device, that manipulates and transforms data represented as physical (electronic) quantities within the computer system’s registers and memories into other data similarly represented as physical quantities within the computer system memories or registers or other such information storage, transmission or display devices.

The meaning of “non-transitory computer-readable medium” should be construed to exclude only those types of transitory computer-readable media which were found to fall outside the scope of patentable subject matter under 35 U.S.C. § 101 in *In re Nuijten,* 500 F.3d 1346, 1356-57 (Fed. Cir. 2007). The use of this term is to be understood to remove only propagating transitory signals per se from the claim scope and does not relinquish rights to all standard computer-readable media that are not only propagating transitory signals per se.

The following description of exemplary embodiments of the present invention is generally presented with respect to an advanced thermal interposer device or ATI. However, embodiments in accordance with the present invention are not limited to use with or on ATIs. Rather, embodiments in accordance with the present invention are well suited to any thermal control application.

Multi-Input Multi-Zone Thermal Control for Device Testing

FIG. 1A illustrates an exemplary block diagram of elements of an automated test system environment 100 that may serve as a platform for embodiments in accordance with the present invention. Test system 100 comprises a device under test (DUT) 110, for example, an integrated circuit device, a system in a package (SIP), and/or a multi-chip module (MCM). The device under test is typically packaged, but that is not required. A socket 105 is coupled to device under test 110, e.g., utilizing package leads on the DUT 110, to send and receive test signals and power to device under test 110. Socket 105 is typically coupled to, and tests, a single device under test 110 at a time, although that is not required. Socket 105 may be mounted to, or coupled to, a load board (not shown) for electrically coupling the socket 105 to a test controller, e.g., for electrical testing of DUT 110.

In accordance with embodiments of the present invention, a novel active thermal interposer device 120 is coupled to the backside or top of device under test 110. Active thermal interposer device 120 may be customized for a specific design of device under test 110, in some embodiments. In some embodiments, there may be a thermal interface material 122 between active thermal interposer device 120 and device under test 110. Such a thermal interface material, if present, is designed to improve thermal coupling between active thermal interposer device 120 and device under test 110.

Active thermal interposer device 120 is further coupled to a cold plate 130. In some embodiments, there may be a thermal interface material 124 between active thermal interposer device 120 and cold plate 130. Such a thermal interface material, if present, is designed to improve thermal coupling between active thermal interposer device 120 and cold plate 130.

In an embodiment, a cooling fluid, e.g., comprising glycol, although other fluids, including air, may be used, is generally circulated through cold plate 130. To adjust the temperature of the cold plate 130, the temperature of the cooling fluid may be adjusted, in some embodiments. In some embodiments, as illustrated in FIG. 1A, the flow of the cooling fluid may also be adjusted, e.g., increased, reduced, started, and/or stopped. As illustrated, chiller 135 cools the cooling fluid, e.g., to −60 degrees C. The cooling fluid flows 137 to valve 132. Valve 132, under the control of thermal controller 145 via control signal 146, regulates the flow 133 of cooling fluid to cold plate 130, based on one or more temperature measurements 134. After cycling through cold plate 130, the cooling fluid is returned 136 to the chiller 135. Cold plate 130 may also be air or gas cooled, in some embodiments.

In some embodiments, cold plate 130 may comprise an evaporator and/or phase change cooling system. In such embodiments, chiller 135 may comprise a compressor and/ or radiator, for example. In some embodiments, changes to a duty cycle of a phase change cooling system may be utilized to adjust an amount of heat extracted from cold plate 130.

Active thermal interposer device 120 functions to apply heat energy to one or more temperature regions of device under test 110. For example, each die of a multi-chip module device under test may be individually temperature controlled. To accomplish such heating, active thermal interposer device 120 comprises one or more heating elements, as further described below. The heating elements of active thermal interposer device 120 define the temperature regions of device under test 110. In some embodiments, the heating elements may comprise resistive traces on a ceramic substrate. In some embodiments, the heating elements may comprise cooling elements, e.g., Peltier devices or other forms of thermoelectric coolers (TEC), capable of cooling as well. However, any suitable heating and/or cooling technology, in any combination, is well suited to embodiments in accordance with the present invention. Active thermal interposer device 120 also functions to couple heat energy from device under test 110 to cold plate 130 and/or to cooling elements within active thermal interposer device 120, in some embodiments.

Active thermal interposer device 120 further comprises one or more temperature measurement devices, e.g., resistance temperature detectors and/or thermocouples. The one or more temperature measurement devices are configured to measure a temperature of a region of device under test 110. The one or more temperature measurement devices may be located within or in close proximity to the heating elements of active thermal interposer device 120. In some embodiments, active thermal interposer device 120 may comprise temperature measurement devices characterized as not within or in close proximity to the heating elements of active thermal interposer device 120. In some embodiments, a load board may comprise temperature measurement devices. Each of the one or more temperature measurement devices sends a temperature signal 121 to thermal controller 145. Socket 105, device under test 110, active thermal interposer device 120, and cold plate 130 may be collectively known as or referred to as a test stack when coupled together as illustrated in FIG. 1A.

Test system 100 further comprises a thermal controller 145. Thermal controller 145 sends control signals 1477 to power supply 140 to supply electrical power 141 to one or more heating elements of active thermal interposer device 120. Each heating element of active thermal interposer device 120 may be individually controlled. Accordingly, there are typically more power signals 141 than illustrated. There may be more than one power supply, in some embodiments. Based on temperature signal 121 from one or more of the plurality of temperature measurement devices, thermal controller may control power supply 140 to change the power supplied to a heating element. Power supply 140 may change a voltage level and/or pulse width modulate a voltage supplied to a heating element, in some embodiments. Thermal controller 145 also controls the amount of heat energy extracted 136 from cold plate 130. For example, thermal controller 145 controls the temperature of cold plate 130. Thermal controller 145 controls value 132 based on temperature signal 121.

It is to be appreciated that cold plate 130 extracts heat, through active thermal interposer device 120, from substantially all of device under test 110. In addition, cold plate 130 typically has a large thermal mass, and does not change temperature quickly. Accordingly, heating elements of active thermal interposer device 120 may often be required to overcome the cooling effect of cold plate 130, during DUT testing, for example. In some embodiments, different regions of a device under test 110 may be heated and/or cooled to different temperatures. For example, one region of device under test 110 may be heated to 100 degrees C., e.g., via a heater within active thermal interposer device 120, while another region of device under test 110 may be allowed to cool toward the temperature of cold plate 130 with no heat applied to such region by active thermal interposer device 120. Such differential heating and/or cooling of different regions of device under test 110 may produce a thermal gradient across or between regions of device under test 110, in some embodiments.

It is appreciated that active thermal interposer device 120 is a separate device from cold plate device 130 and socket device 105. Active thermal interposer device 120 is typically customized for a particular device under test and/or socket combination, but that is not required. In this novel manner, since the active thermal interposer device is a stand alone device, different active thermal interposer devices may be utilized with standard cold plates and/or a variety of sockets in various combination to test a variety of devices. For example, a functionally similar multi-chip module may have multiple versions with similar or identical pin layouts but a different physical arrangement of chips. Testing of such a family could be performed with the same socket with different active thermal interposer devices to account for a different physical arrangement of chips.

Figure 1B:
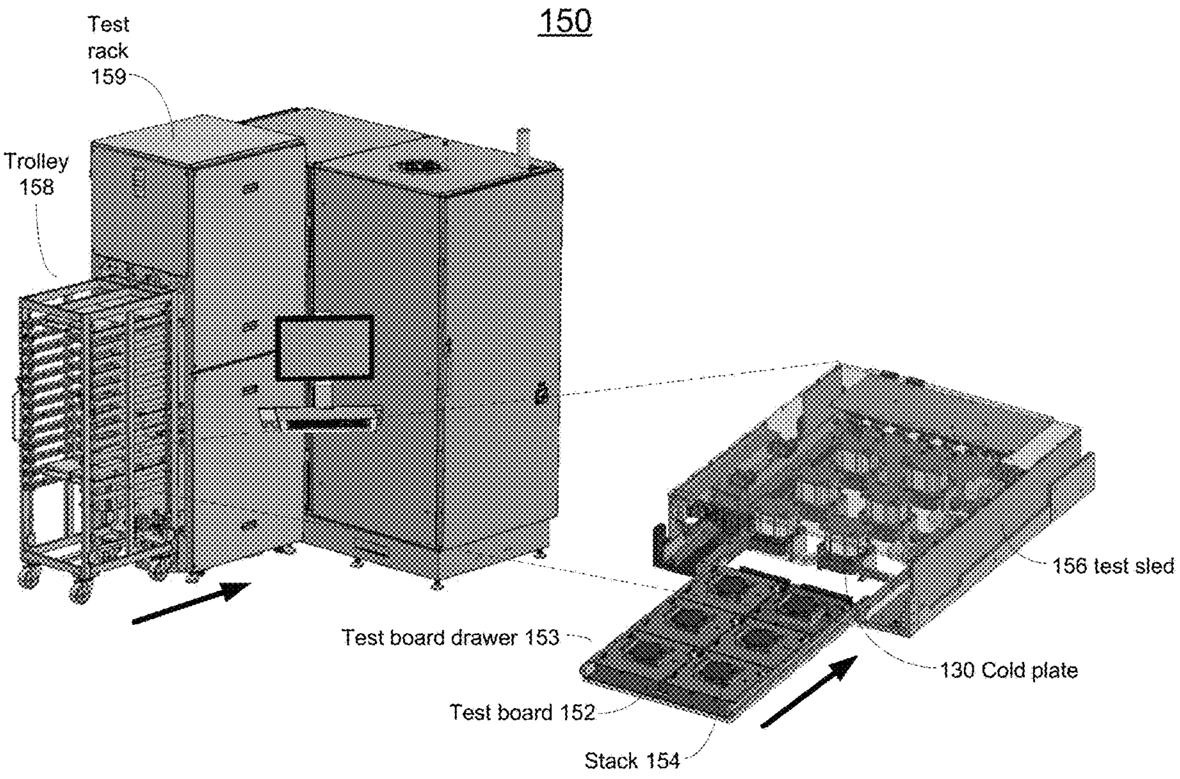
FIG. 1B illustrates a perspective view of an exemplary test system, in accordance with embodiments of the present invention.

FIG. 1B illustrates a perspective view of an exemplary test system 150, in accordance with embodiments of the present invention. Test system 150 comprises a plurality of test sleds, for example, exemplary test sled 156. Test sled 156 comprises a plurality, e.g., six, cold plates 130. Test sled 156 is configured to accept a test board drawer 153, which may be inserted into the main body of test sled 156. Test board drawer 153 comprises a test board 152. Test board 152 comprises a plurality, e.g., six, of stacks 154. Each of stacks 154 comprises a socket 105, a device under test 110 and an active thermal interposer device 120. Stack 154 may also include thermal interface materials 122 and/or 124, in some embodiments. Test sled 156 further comprises power distribution, and couplings to power, electrical test signals, and cooling fluids. Test sled 156 is configured to couple the plurality of cold plates to the stacks 154 when test board drawer 153 is inserted into the test sled 156. It is appreciated that the perspective of a test stack as illustrated in FIG. 1B is reversed with respect to the test stack as illustrated in FIG. 1A. For example, the cold plate 130 is on the top in FIG. 1B, while the cold plate 130 is illustrated on the bottom in FIG. 1A.

A plurality of test sleds 156, e.g., 12, is configured to be placed in trolley 158, for insertion into a test rack 159. When inserted into test rack 159, the necessary electrical power, test signals, and cooling are supplied to each test stack comprising a cold plate 130, an active thermal interposer device 120, a device under test 110 and a socket 105 to be asynchronously tested by test system 150. In this novel manner, up to, for example, 72, devices may be heated and/or cooled, and electrically tested at the same time in a single test system 150.

Figure 1C:
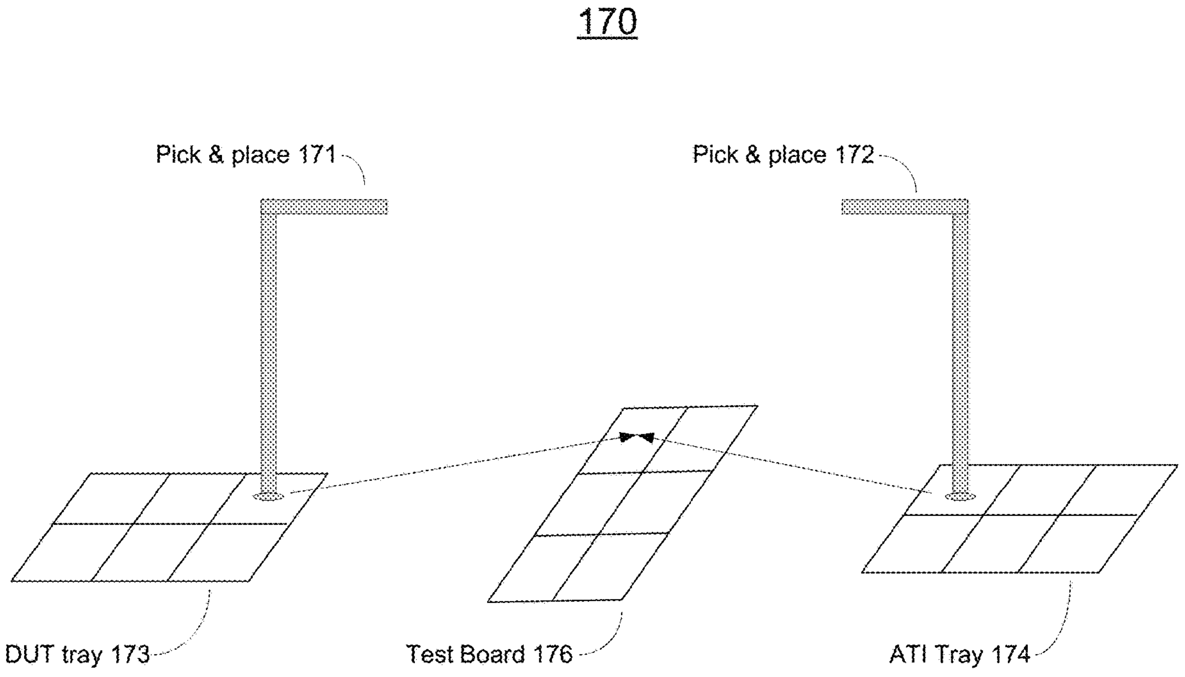
FIG. 1C illustrates an exemplary testing system including the robotic mechanisms for automatically picking and placing a DUT into the socket and also for picking an active thermal interposer device and placing it into the socket with the DUT, in accordance with embodiments of the present invention.

FIG. 1C illustrates an exemplary testing system 170 including the robotic mechanisms for automatically picking and placing a DUT into the socket and also for picking an active thermal interposer device and placing it into the socket with the DUT, in accordance with embodiments of the present invention. After placement into the socket, the DUT and the active thermal interposer device are passed to a thermal head. For example, the thermal head comprises a cold plate, e.g., cold plate 130. In one embodiment, the thermal head contains 12 slots; each slot containing 6 sockets, therefore 72 DUTs with corresponding active thermal interposer devices can be tested simultaneously. After testing, the active thermal interposer devices may be reused to test other DUTs. Within the thermal head is contained the cold plates which come into contact with the active thermal interposer device during testing.

Within embodiments of the present invention, the active thermal interposer device is known as or referred to as a "stand alone" device because it is not permanently attached to any other device within the testing system, as with the prior art testing systems and environments. In other words, the active thermal interposer device, being custom designed for the DUT, is actively picked and placed, as a stand alone part, and inserted into the socket as described above. Therefore, in order to redesign the testing system for use with another type of DUT, only the active thermal interposer device, the DUT and the socket need to be redesigned, while the remainder of the testing system, including a cold plate, may be reused.

Regarding FIG. 1C, a first pick and place arm 171 retrieves a device under test, e.g., DUT 110 of FIG. 1A, from a tray of DUTs 173, and places it into a socket, e.g., socket 105 (FIG. 1A) on a test board 176. The test board 176 may correspond to test board 152 of FIG. 1B. A second pick and place arm 172 retrieves an active thermal interposer device, e.g., active thermal interposer device 120 of FIG. 1A, from a tray of active thermal interposer devices 174, and places the active thermal interposer device on top of the DUT, which is already on test board 176. The pick and place arms 171, 172 may grasp the DUT and/or active thermal interposer device via any suitable means, including, for example, by grasping on sides and/or above and below, and/or via vacuum suction, in some embodiments.

Figure 2:
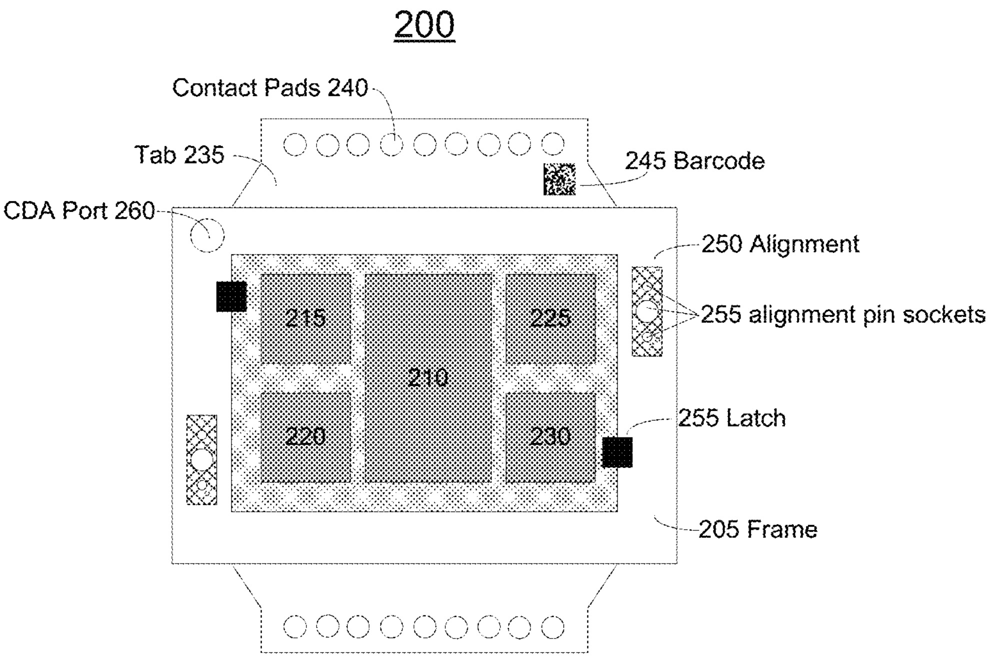
FIG. 2 illustrates an exemplary block diagram of a novel active thermal interposer device, in accordance with embodiments of the present invention.

FIG. 2 illustrates an exemplary block diagram of a novel active thermal interposer device 200, in accordance with embodiments of the present invention. Active thermal interposer device 200 comprises a frame 205 upon which other elements may be attached or mounted. Frame 205 may comprise any suitable materials, for example, thermoplastics. Frame 205 comprises tabs 235. Tabs 235 are configured for handling and/or manipulation of active thermal interposer device 200, for example, by automated grasping equipment and/or pick and place equipment. A plurality of contact pads 240 may be located on tabs 235 for making electrical contact to active thermal interposer device 200. For example, contact pads 240 may be configured to mechanically and electrically couple with pogo pins (not shown) to couple electrical power and/or thermal sensor signals to/from active thermal interposer device 200. In some embodiments, the contact pads 240 may comprise pads of different sizes and/or shapes, for example, to correspond to different current capacities. In accordance with embodiments of the present invention, the ambient atmosphere near any pogo pins should be kept above the dew point in order to minimize and/or reduce condensation, which may have a deleterious effect on contact reliability. In accordance with embodiments of the present invention, active thermal interposer device 200 may comprise one or more compressed dry air (CDA) ports 260, which may be coupled to a source of dry air, and utilized to inject dry air into the test stack in order to prevent condensation. Active thermal interposer device 200 may comprise an insulative cover (not shown) to help prevent condensation, in some embodiments.

Active thermal interposer device 200 may comprise latches 255, in some embodiments. Latches 255 are configured to securely couple a device under test (not shown) to the active thermal interposer device 200. For example, latches 255 may extend over a device under test and/or its socket, and lock it into place. Active thermal interposer device 200 may comprise alignment features 250, in some embodiments. Alignment features 250 may comprise fiducial alignment markings and/or receptacles, for example, micro-alignment bushings, e.g., alignment pin sockets 251, to assist and/or ensure alignment of active thermal interposer device 200 into a test stack, as described with respect to FIG. 1A.

In accordance with embodiments of the present invention, the socket, e.g., socket 105 of FIG. 1A, and/or active thermal interposer device 200 comprise features to prevent the active thermal interposer device 200 from making undesired electrical contact with electrical contacts of the socket if a device under test is not present. Such undesired contact may lead to detrimental voltages and/or currents from the active thermal interposer device 200 coupled into test equipment via the socket and/or physical damage to socket contacts. Locating contact pads 240 outside of a footprint of a DUT, e.g., outside of a socket, may help to prevent such undesired contact, in some embodiments.

In some embodiments, active thermal interposer device 200 may comprise a barcode 245, e.g., for identification purposes. Barcode 245 may comprise any suitable encoding, including two-dimensional barcodes, in accordance with embodiments of the present invention. Barcode 245 may uniquely identify a particular active thermal interposer device 200, in some embodiments. Uniquely identifying a particular active thermal interposer device 200 may allow calibration information for the particular active thermal interposer device 200 to be retried from a database and utilized during testing with the particular active thermal interposer device 200, in some embodiments. In some embodiments, barcode 245 may be utilized to record and track which particular active thermal interposer device 200 is used for testing with a particular socket, e.g., socket 105 of FIG. 1A, and/or is used for testing a particular device under test, e.g., DUT 110 of FIG. 1A.

In some embodiments, barcode 245 may encode calibration parameters, e.g., for thermal sensors, corresponding to a particular active thermal interposer device 200. For example, such encoding may eliminate a need to access a database to retrieve such information. Barcode 245 may be utilized to ensure that a correct active thermal interposer device 200 is selected, installed, and/or used for a particular test. For example, barcode 245 may be utilized to authorize and/or authenticate a particular active thermal interposer device for use in particular equipment and/or for use in a particular test. Barcode 245 may be read when an active thermal interposer device is picked up for placement, e.g., from a storage location, and/or when placed in a test stack. In some embodiments, the information encoded on barcode 245 may be encrypted. For example, information may be encrypted and then encoded by a standard barcode encoding.

Active thermal interposer device 200 may comprise a plurality of active thermal regions or zones 210, 215, 220, 225, 230, in some embodiments. In some embodiments, there may be a single thermal region. Each thermal region may correspond to a region of a device under test. For example, active thermal region 210 may correspond to a large die of a multi-chip module, which active thermal regions 215, 220, 225, and 230 correspond to other and/or smaller chips of the multi-chip module. In some embodiments, multiple thermal regions may correspond to a single die or chip.

Each of active thermal regions 215, 220, 225, and 230 are configured to selectively apply thermal energy to a device under test, e.g., DUT 110 of FIG. 1A. The active thermal regions 215, 220, 225, and 230 are also configured to selectively extract thermal energy from a device under test. The extraction of thermal energy may be via a coupling to a cold plate, e.g., cold plate 130 of FIG. 1A, and/or via a Peltier device within the active thermal regions 215, 220, 225, and 230. Each active thermal region may be independently controlled to a different temperature.

Figure 3:
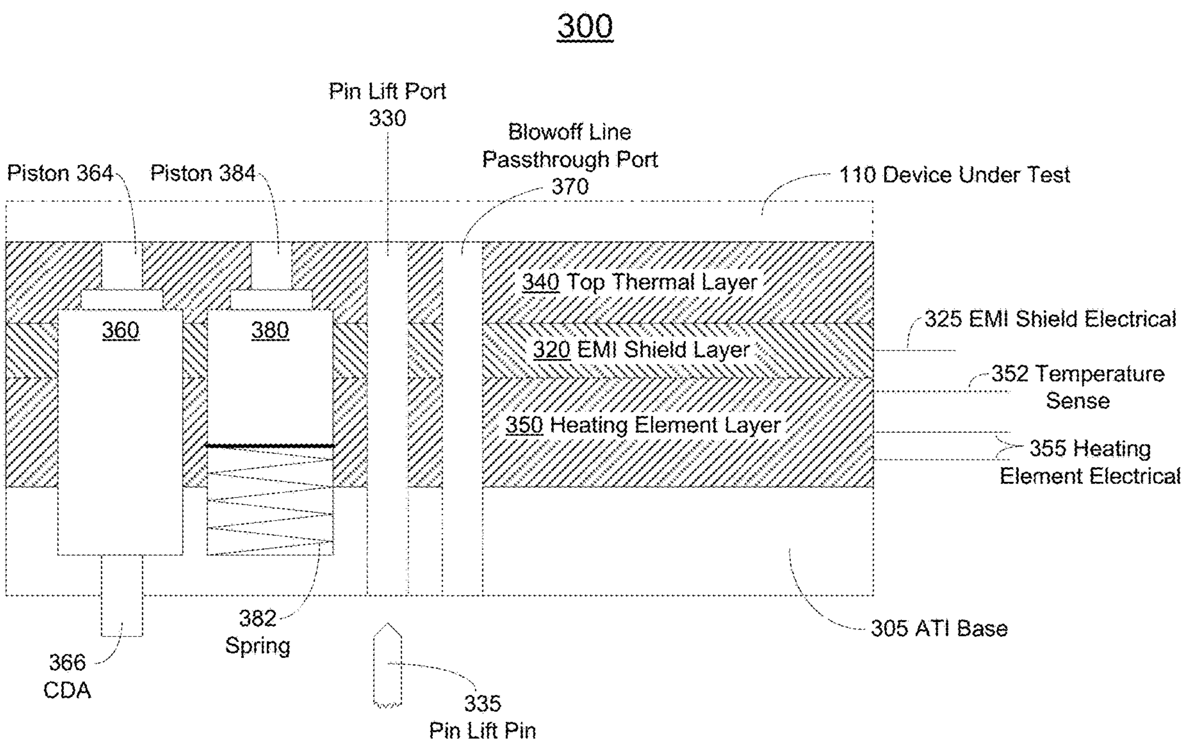
FIG. 3 illustrates an exemplary block diagram cross sectional view of a novel active thermal interposer device, in accordance with embodiments of the present invention.

FIG. 3 illustrates an exemplary block diagram cross sectional view of a novel active thermal interposer device 300, in accordance with embodiments of the present invention. In the embodiment of FIG. 3, a device under test 110 is illustrated at the top of the active thermal interposer device 300. Device under test 110 is included for illustration, and is not a part of active thermal interposer device 300. Active thermal interposer device 300 comprises a heating element layer 350, mounted to or on an active thermal interposer device base 305. Heating element layer 350 comprises a plurality of heating elements configured to apply heat energy to device under test 110. The heating elements may comprise resistive traces or other suitable types of heaters. Active thermal interposer device 300 may also comprise cooling elements, e.g., Peltier devices, within heating element layer 350, in some embodiments. The plurality of heating and/or cooling elements are coupled to a plurality of electrical signals 355, for providing controlled power to the heating and/or cooling elements. Heating element layer 350 may include low resistance traces, e.g., from electrical signals 355 to the actual heating elements, in some embodiments. Heating element layer 350 also comprises one or more temperature measurement devices, e.g., thermocouples, (not shown), which are coupled to control elements via temperature a plurality of sense signals 352.

In accordance with embodiments of the present invention, active thermal interposer device 300 may comprise a novel electromagnetic interference (EMI) shield layer 320. Each of the plurality of heating elements in layer 350 may utilize currents of many tens of amperes, e.g., to generate heating of hundreds of watts during testing of a DUT. In accordance with embodiments of the present invention that utilize switching such currents to control temperature, e.g., pulse width modulation, such switching may induce unwanted electromagnetic noise signals that are deleterious to the operation and/or test of integrated circuits, e.g., device under test 110 of FIG. 1A, coupled to the active thermal interposer device 300. In some embodiments, EMI shield layer 320 comprises a solid layer of conductor, e.g., conductive traces similar to those utilized in heating element layer 350. In some embodiments, EMI shield layer 320 comprises a grid of conductive elements. The grid may be sized to attenuate desired wavelength(s) of electromagnetic interference. EMI shield layer 320 may have an electrical connection 325, e.g., to ground, in some embodiments.

Figure 5:
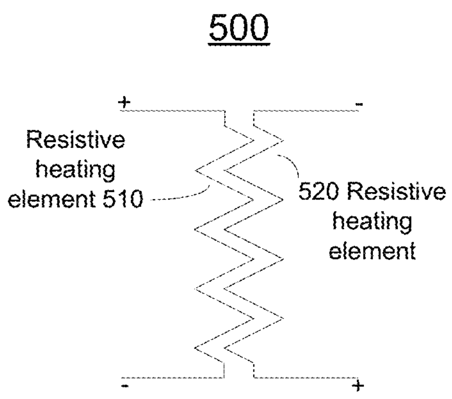
FIG. 5 illustrates a schematic of an exemplary heating element, in accordance with embodiments of the present invention.

Referring now to FIG. 5, FIG. 5 illustrates a schematic of an exemplary heating element 500, in accordance with embodiments of the present invention. Heating element 500 is well suited to use in active thermal interposer device 120 (FIG. 1A). Heating element 500 may be powered by a voltage/current drive signal, and comprises two resistive heating elements 510 and 520. Heating elements 510 and 520 may comprise resistive traces on a ceramic substrate, in some embodiments. Heating elements 510 and 520 comprise resistive traces in a generally serpentine pattern, although the straight traces illustrated are not required. The traces may have a substantially curved nature, in some embodiments. Heating elements 510 and 520 are close together, for example, as close as allowed by design rules for the technology, including current carrying capacity and insulative separation requirements. Heating elements 510 and 520 may be operated together while phase reversed. For example, in the illustration of FIG. 5, current may flow from top to bottom in heating element 510, and from bottom to top in heating element 520. In this novel arrangement, electromagnetic fields generated by switching of currents within heating element 510 may be substantially canceled by inverted electromagnetic fields generated by switching of currents within heating element 520, reducing deleterious electromagnetic interference. If elements of heating elements 510 and 520 comprise parallel elements, capacitive coupling may be beneficial as well, e.g., reducing inductance in the resistive heating elements.

Referring once again to FIG. 3, active thermal interposer device 300 comprises a top thermal layer 340. Thermal layer 340 functions to couple heat energy from heating element layer 350 to a device under test and vice versa. Thermal layer 340 is non conductive, in some embodiments. Thermal layer 340 should have a high degree of co-planarity in order to facilitate good thermal conduction to a device under test, in some embodiments.

Active thermal interposer device 300 should be compatible and complementary with conventional elements of integrated circuit test equipment. In some embodiments, active thermal interposer device 300 may comprise a blowoff line passthrough port 370. Blowoff line passthrough port 370 couples to a conventional blowoff line, as is typically used to break a seal or kick off a device under test, prior to removing the device under test from the test system. For example, blowoff line passthrough port 370 mates with a blowoff line port of a conventional cold plate, e.g., cold plate 130 of FIG. 1A. There may be a plurality of blowoff line passthrough ports 370 in an instance of active thermal interposer device 300, for example three arranged in an equilateral triangle, in some embodiments. A blowoff line passthrough port 370 typically extends through active thermal interposer device 300.

Active thermal interposer device 300 may also or alternatively comprise a device under test pin lift port 330, in some embodiments. Device under test pin lift port 330 may be aligned with a similar port or channel in a cold plate, e.g., cold plate 130 of FIG. 1A. Device under test pin lift port 330 enables a device under test lift pin 335 to raise a device under test above the top of the active thermal interposer device 300. The lift pin 335 typically extends from or through a cold plate, e.g., cold plate 130 of FIG. 1A, and/or from a chuck mechanism (not shown). In accordance with some embodiments of the present invention, the lift pin 335 may be lengthened, in contrast to a conventional lift pin, to account for the thickness of active thermal interposer device 300. There may be a plurality of pin lift ports 330 in an instance of active thermal interposer device 300, for example three arranged in an equilateral triangle, in some embodiments. A pin lift port 330 typically extends through active thermal interposer device 300.

Active thermal interposer device 300 may also or alternatively comprise a device under test air-powered kick off device 360. Kick off device 360 comprises a kick off piston 364 that selectively pushes against DUT 110 in response to pressure applied via compressed dry air (CDA) port 366. Active thermal interposer device 300 may also or alternatively comprise a device under test spring loaded kick off device 380. Device under test spring loaded kick off device 380 comprises a spring 382 that pushes piston 384 to push against DUT 110. A force exerted by spring 382 may be controlled, in some embodiments. For example, spring 382 may be constrained by a releasable latch mechanism, in some embodiments. In other embodiments, spring 382 may comprise memory wire, for example, which expands in response to an applied voltage. In some embodiments, spring 382 may not be controlled. For example, spring 382 may always apply a force against DUT 110. When, for example, a retention latch, e.g., latch 255 of FIG. 2, is released, spring 382 may act, forcing piston 384 against DUT 110, providing sufficient force to dislodge DUT 110 from active thermal interposer device 300.

Figure 4:
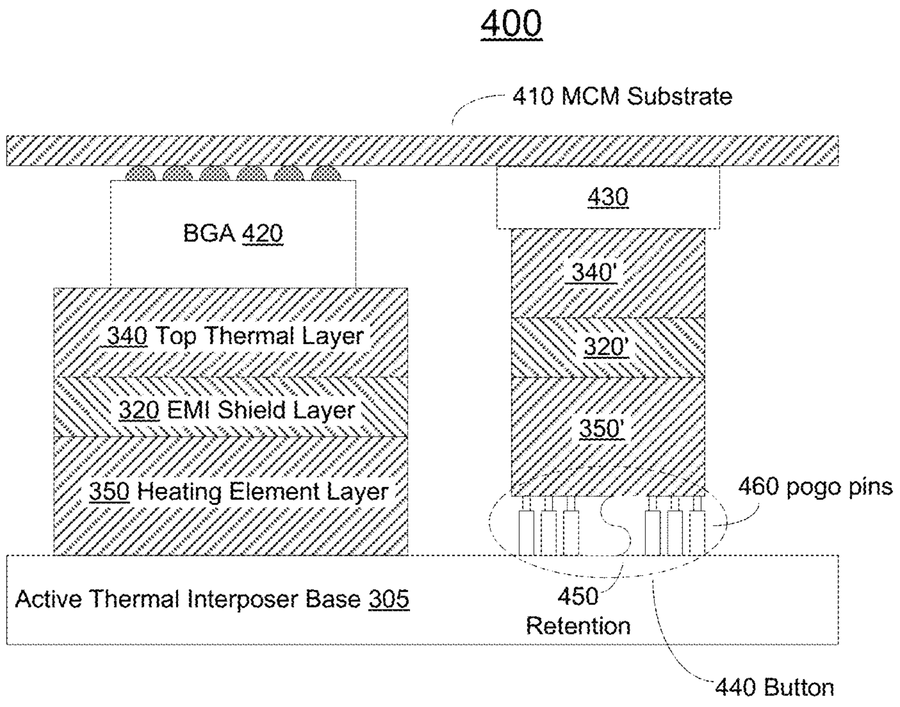
FIG. 4 illustrates an exemplary block diagram cross sectional view of a thermal management system including a novel active thermal interposer device, in accordance with embodiments of the present invention.

It is appreciated that multi-chip modules often comprise integrated circuit devices of differing heights or thickness. FIG. 4 illustrates an exemplary block diagram cross sectional view of a thermal management system including a novel active thermal interposer device 400, in accordance with embodiments of the present invention. Active thermal interposer device 400 is configured to mechanically and thermally couple to a multi-chip module comprising integrated circuit devices of differing heights or thickness. FIG. 4 illustrates a multi-chip module device under test comprising a substrate 410, for example a printed wiring board or a ceramic substrate, an integrated circuit packaged in a ball grid array (BGA) 420, and another integrated circuit 430 packaged in a lower profile package, e.g., a plastic-leaded chip carrier (PLCC) or a "glop top" conformal coating. Package 420 is the tallest structure of the multi-chip module. Elements 410, 420 and 430 are illustrated for context, and are not a part of active thermal interposer device 400.

Elements 305, 350, 320 and 340 are as previously described with respect to FIG. 3, and may be described as or referred to as a test stack and/or thermal stack. Elements 350, 320 and 340 may correspond to thermal region 210 of FIG. 2, for example. Elements 350', 320', and 340' have corresponding functions to elements 350, 320 and 340, and may be described as or referred to as a (different) thermal stack. Elements 350', 320', and 340' may correspond to thermal region 230 of FIG. 2, for example. In general, elements 350', 320', and 340' may be the same thickness as the corresponding elements 350, 320 and 340, but that is not required. In contrast to elements 350, 320 and 340, elements 350', 320', and 340' are mounted on top of button 440. Button 440 comprises a plurality of pogo pins 460 and optional retention mechanism 450. Button 440 is configured to raise (in the configuration of FIG. 4) elements 350', 320' and 340' so that top thermal layer 340' is in good thermal contact with integrated circuit package 430.

The plurality of pogo pins 460 push heating element layer 350', EMI shield layer 320' and top thermal layer 340' up so that top thermal layer 340' is in good thermal contact with integrated circuit package 430. The plurality of pogo pins 460 also couple electrical signals to heating element 350' and EMI shield layer 320'. Optional retention mechanism 450 may keep elements 350', 320', and 340' from rising too far, for example, when a DUT is removed. It is appreciated that heating element layer 350' may comprise contact pads to couple with pogo pins 460. Heating element layer 350 may comprise similar pads, or may utilize a different mechanism to make electrical coupling(s) with a test apparatus, in embodiments. In accordance with embodiments of the present invention, a single active thermal interposer device may comprise multiple thermal stacks on multiple buttons at different heights.

Figure 6:
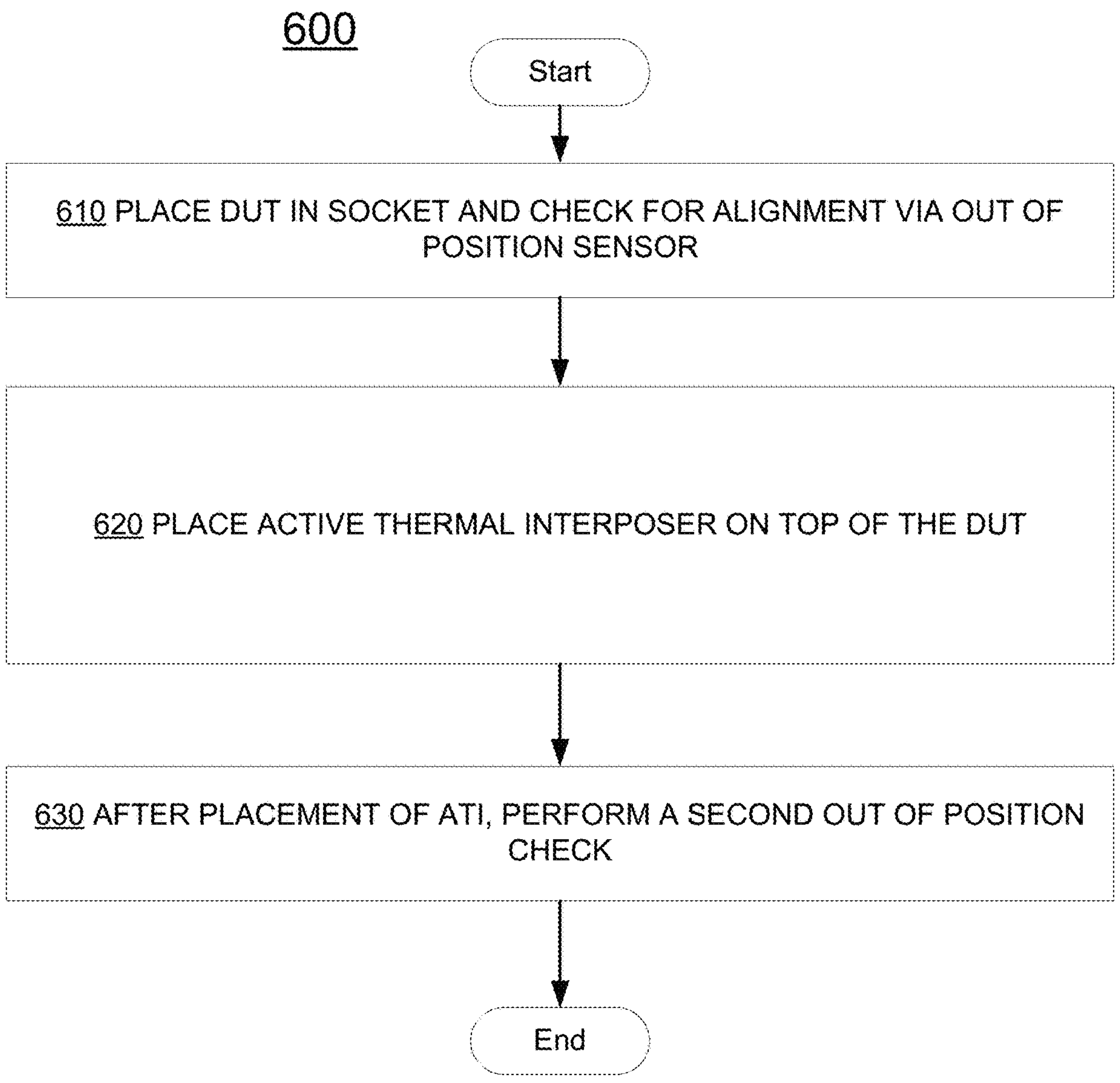
FIG. 6 illustrates an exemplary computer-controlled method for testing circuits of an integrated circuit semiconductor wafer, in accordance with embodiments of the present invention.

FIG. 6 illustrates an exemplary computer-controlled method 600 for testing circuits of an integrated circuit semiconductor wafer, in accordance with embodiments of the present invention. Method 600 may be practiced by test system 170 as described in FIG. 1C, in some embodiments. In 610, a handler device places a device under test, e.g., DUT 110 of FIG. 1A, into a socket, e.g., socket 105 of FIG. 1A, and checks if the DUT is aligned via an out of position (OOP) sensor. In 620, the handler places the active thermal interposer device, e.g., active thermal interposer device 120 of FIG. 1A, on top of the DUT. The alignment features in the socket and on the active thermal interposer device, e.g., 250 of FIG. 2, assist in placing the active thermal interposer device on top of the DUT. In 630, after the active thermal interposer device is placed, a second OOP check is performed to ensure that the active thermal interposer device is placed in a planar fashion and is not tilted or otherwise misaligned.

Figure 7:
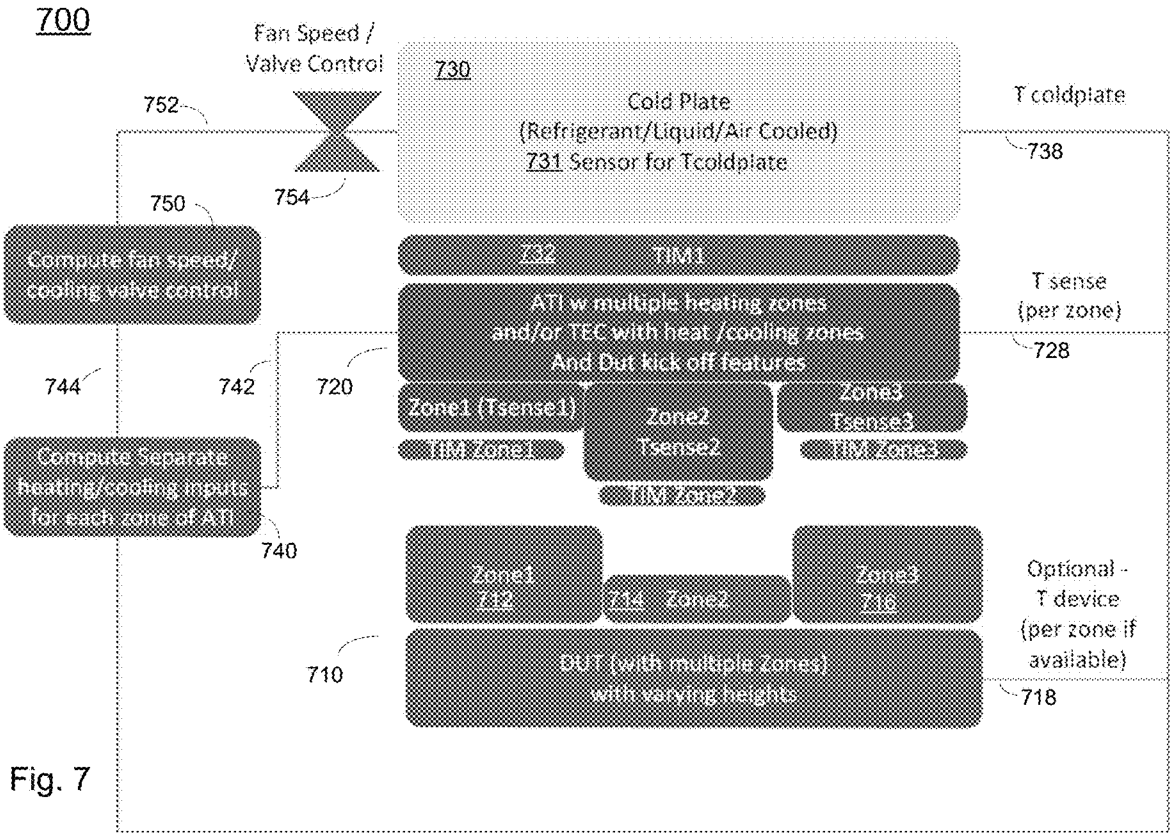
FIG. 7 is an exemplary block diagram of a control system for thermal control of a plurality of devices under test, in accordance with embodiments of the present invention.

FIG. 7 is an exemplary block diagram of a control system 700 for thermal control of a plurality of devices under test, in accordance with embodiments of the present invention. The control elements of control system 700, e.g., active thermal interposer device heating/cooling control 740 and/or cold plate control 750, may correspond to thermal controller 145 of FIG. 1A, in some embodiments. Device under test (DUT) 710 may have multiple zones of varying heights for temperature control, for example, zone 1 712, zone 2 714, and zone 3 715. An on-chip and/or in-package temperature measurement 718 is accessed, if available. In some embodiments, a temperature measurement from one or more temperature sensors on a load board may be accessed. It is desirable to access an on-chip, in-package, and/or load board temperature measurement corresponding to each zone. Any suitable on-chip, in-package, and/or load board temperature measurement device(s) may be utilized, e.g., a band gap, a ring oscillator, and/or a thermocouple.

Active thermal interposer device 720 is thermally coupled to device under test 710. Active thermal interposer device 720 comprises multiple heating and/or cooling zones to correspond to the multiple zones of device under test 710. In some embodiments, some heating and/or cooling zones of active thermal interposer device 720 may be mounted on buttons to account for different heights of the multiple zones of device under test 710, as previously described with respect to FIG. 4. A temperature measurement of cold plate 730 and one or more temperature measurements of each active thermal interposer device zone may be accessed at 738, 728, and/or 718.

Active thermal interposer device 720 is thermally coupled to a cold plate, e.g., cold plate 130 of FIG. 1A, e.g., via thermal interface material 732. A temperature measurement 738 of cold plate 730 made by cold plate temperature sensor 731 is accessed.

The several temperature measurements, e.g., 718, 728, 738 are inputs to active thermal interposer device heating/cooling control 740. Control 740 generates one or more control outputs for each zone of active thermal interposer device 720 to achieve a desired temperature for each of such zones. Control 740 also produces an output 744 that is input to cold plate control 750. Cold plate control 750 is configured to achieve a desired temperature of cold plate 730. Cold plate control 750 outputs a control signal 752 that controls operation of fan speed and/or coolant valve 754.

In accordance with embodiments of the present invention, one or both of active thermal interposer device heating/cooling control 740 and/or cold plate control 750 may utilize dual loop proportional-integral-derivative (PID) algorithms that are configured to utilize both heating and cooling elements to control a desired temperature for each zone of the device under test 710. For example, a first control loop may control a fan speed (for air control) and/or a fluid regulation valve (for liquid/refrigerant control) of the cold plate to control a temperature of the cold plate 730 as measured by cold plate temperature sensor 731. A second control loop may operate relatively faster than the first control loop to control temperatures of each zone of active thermal interposer device 720. As previously presented, each zone of active thermal interposer device 720 may comprise heating and cooling elements, in some embodiments.

In accordance with embodiments of the present invention, a temperature zone may comprise an individual packaged or unpackaged die, or a portion of a die. For example, some integrated circuits are characterized as relatively large and/or designed to operate at relatively high power levels. Examples of such integrated circuits may include central processing units (CPUs), graphics processing units (GPUs), Network Processing Units (NPUs), multi-core processing units, power semiconductors, and the like. Due to their large size and/or high power operational characteristics, such integrated circuits may require application of large amounts of heat energy and/or cooling to achieve desired test temperatures.

Large and complex integrated circuits frequently comprise a plurality of functional units, e.g., multiple processing cores, which are physically distinct. It may be desirable to test such functional units in whole or in partial isolation from other function units of a die. For example, a GPU comprising multiple floating point units may be designed to utilize a single floating point unit at times during operation, and turn off other floating point units, e.g., those that are not currently required, in order to reduce power consumption. It may be desirable to test the GPU under similar thermal conditions. For example, it may be desirable to run functional tests on a portion of the GPU corresponding to an operational floating point unit at a high temperature, while other portions of the GPU are at a different, e.g., lower, temperature, simulating non-operation.

In addition, the heat energy and/or cooling required to achieve a desirable test temperature for large and/or high-powered die may exceed the capacity of a single heating element of an active thermal interposer device. For example, conductive traces of an active thermal interposer device may have current capacity limitations. Further, other components of a single heating element and/or an active thermal interposer device may limit an amount of heat energy generated to be less than required to supply sufficient heat energy to achieve a desired temperature of a die under test.

Other types of integrated circuits may be characterized as relatively small and/or designed to operate at relatively low power levels. Examples of such integrated circuits may include microcontrollers, dynamic RAMs, application-specific integrated circuits, analog and mixed signal devices, and the like. Due to their small size and/or low power operational characteristics, such integrated circuits may not require application of large amounts of heat energy and/or cooling to achieve desired test temperatures.

A variety of temperature measurements for devices under test may be available for any give device under test. A measurement of an integrated circuit junction temperature, Tj, is a good input as a measured process variable to a temperature control loop. A direct external measurement of the case or die temperature is typically available from an active thermal interposer device system, and may be used as a measured process variable.

Junction temperature is a function of power consumption of an integrated circuit, and may be approximated by Relation 1 below:

$$Tjunction = Tcase + P\theta i \qquad \text{(Relation 1)}$$

where Tcase is case or package temperature, P is power consumed by the integrated circuit. The value "θi" is the lumped thermal resistance of the integrated circuit package comprising, for example, a thermal resistance from the integrated circuit to a coupled heatsink to ambient and/or a thermal resistance from the integrated circuit to a circuit board.

A thermal resistance of an integrated circuit package, θi, is highly consistent among similar integrated circuits under test, and may be treated as a constant for a given device within a DUT.

Accordingly, a good approximation of junction temperature may be obtained by measuring, or controlling, power supplied to a portion, e.g., an integrated circuit, of a device under test. Alternatively, power alone, e.g., without estimating junction temperature, may be used directly. Accordingly, power supplied to a thermal domain of a device under test may be utilized as a measured process variable in a thermal control loop, in accordance with embodiments of the present invention. Highly complex integrated circuits often have multiple power rails, and power may be measured and/or controlled by power rail for such devices as well.

In accordance with embodiments of the present invention, advance knowledge of a test profile may be used in a thermal control loop to adjust, or initiate adjustment, of a temperature of a DUT thermal zone. For example, with foreknowledge that a particular test profile will cause a thermal zone of a DUT to change to a very high power consumption mode, a thermal control loop may initiate a high rate of cooling in advance of an actual measured increase in DUT temperature and/or an increase in DUT power consumption. Similarly, with foreknowledge that a particular test profile will cause a thermal zone of a DUT to change to a very low power consumption mode, a thermal control loop may initiate a high rate of heating in advance of an actual measured decrease in DUT temperature and/or an decrease in DUT power consumption. Such advanced or anticipatory changes, known as or referred to as a "pre-trigger," to thermal control devices, e.g., cooling plates and/or heating elements, may help to maintain a desired temperature for one or more thermal zones of a DUT, in accordance with embodiments of the present invention. A pre-trigger may not be a physical measurement, or correspond to a contemporaneous physical measurement, in some embodiments. U.S. Pat. No. 9,291,667 entitled "Adaptive Thermal Control," incorporated herein in its entirety by reference, provides further disclosures of advanced or anticipatory pre-trigger events and responses.

The available temperature measurements often vary according to the complexity of the integrated circuits that make up a device under test, e.g., a multi-chip module. For example, highly complex integrated circuits frequently comprise a junction temperature sensor for one or more sections of the integrated circuit. Other types of integrated circuits such as bulk memory may not have a junction temperature sensor. In such cases, other control inputs, including, for example, case temperature measurements, power consumption and/or pre-triggers may be used to control temperature zone(s) of a device under test.

Table 1, below, illustrates common types of integrated circuits and commonly available types of temperature measurements available for such integrated circuits:

TABLE 1

| Die in MCM/SIP | Typical placement | Tsense (Case temp measurement) | Die Tj | Power Sensor (from tester) | Pre-trigger signal (from tester) |
|---|---|---|---|---|---|
| Core Processor | Bare Die | Y | Usually Present | Usually available (Typically separate power supply) | Usually available on Advantest testers |
| Graphics Processor | Bare Die | Y | Usually Present | Usually available (Typically separate power supply) | Usually available on Advantest testers |
| Analog/ Mixed Signal | Encapsulated or bare die | Y | Rarely present | Sometimes available (could be ganged with other supplies) | Can be available-not typically done in the past |
| Memory | Packaged | Y | Usually not present | Sometimes available (could be ganged with other supplies) | Can be available-not typically done in the past |

other portions of the integrated circuit. Such variations in use of control inputs may arise over time and/or processing load as well.

Further, in accordance with embodiments of the present invention, pre-trigger information may change which control inputs are utilized to implement thermal control of a thermal control zone of a device under test. For example, pre-trigger information may indicate that a first thermal zone of a DUT is about to have a heavy workload, and hence increase power consumption, while other thermal zones of the DUT may have a decreased workload and decreased power consumption. Responsive to such indications, thermal control of the first thermal zone may utilize junction temperature as a controlling input, while thermal control of the other thermal zones may utilize power consumption as a controlling input.

Figure 8:
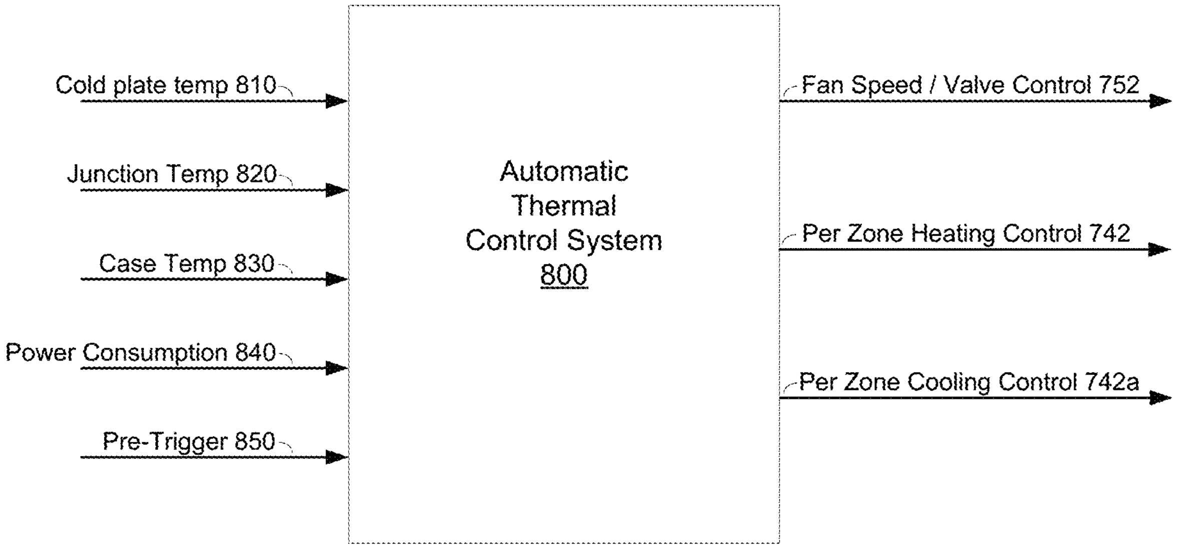
FIG. 8 illustrates a block diagram of an exemplary electronic automatic thermal control (ATC) system, in accordance with embodiments of the present invention.

FIG. 8 illustrates a block diagram of an exemplary electronic automatic thermal control (ATC) system 800, in accordance with embodiments of the present invention. Automatic thermal control system 800 may incorporate active thermal interposer device heating/cooling control function 740 and/or cold plate control function 750, as illustrated in FIG. 7, in some embodiments.

Automatic thermal control (ATC) system 800 accesses a plurality of control inputs for each thermal zone of a device under test, including, for example, cold plate temperature 810, a junction temperature, Tj, 820 of a thermal zone of a device under test, a device under test case temperature, Tcase, 830, an indication of power consumption of a thermal zone of a device under test 840, and/or a pre-trigger signal for a thermal zone of a device under test 850.

Responsive to the control inputs 810, 820, 830, 840 and/or 850, automatic thermal control system 800 produces a plurality of control outputs, based on one or more control inputs. In some embodiments, more than one control input may be utilized by automatic thermal control system 800 to produce its control outputs. In some embodiments, thermal control of different thermal control zones may utilize different control inputs. For example, thermal control system 800 may utilize control inputs cold plate temperature 810, junction temperature 820, power consumption 840 and pre-trigger 850 while thermally controlling a graphics processor, and utilize cold plate temperature 810 and case temperature 830 while thermally controlling an associated bulk memory device.

In addition, in some embodiments, different thermal zones of a single integrated circuit may be controlled according to different control inputs. For example junction temperature may be beneficially used to thermally control a processor core of an integrated circuit, while case temperature measurement(s) may be of greater benefit to thermal control of Automatic thermal control system 800 produces a control signal 752 that controls operation of fan speed and/or coolant valve 754 (FIG. 7). In some embodiments, a cold plate, e.g., cold plate 730 (FIG. 7) may be thermally coupled to all thermal zones of a device under test. In some embodiments, control signal 752 may be functionally summed from control loops for all thermal zones of a device under test. In some embodiments, a desired temperature for a cold plate, e.g., cold plate 730, may be controlled based on a single thermal zone of a device under test, for example, a thermal zone producing a greatest amount of heat. Such a cold plate temperature may be utilized as an input to control loops for the remaining thermal zones of a device under test. However, in some embodiments, such control loops may not control and/or affect the cold plate temperature.

Automatic thermal control system 800 produces a control signal 742 for each thermal zone of a device under test that controls heating element(s) for each heating zone of an active thermal interposer device, e.g., an active thermal interposer device 120 (FIG. 1). In some embodiments, one or more zones of an active thermal interposer device may have a cooling element, e.g., a Peltier device, separate from a cold plate, e.g., cold pate 730. In such embodiments, automatic thermal control system 800 produces a control signal 742*a* for each thermal zone of a device under test that controls cooling element(s) for each thermal zone of an active thermal interposer device. In some embodiments, control signal(s) 742*a* may be a part of control signal(s) 742.

In accordance with embodiments of the present invention, automatic thermal control system 800 may utilize dual loop proportional-integral-derivative (PID) processes that access and utilize multiple control inputs, including "pre-trigger" inputs, from a test system and are configured to utilize both heating and cooling elements to control a desired temperature for each zone of a device under test.

Figure 9:
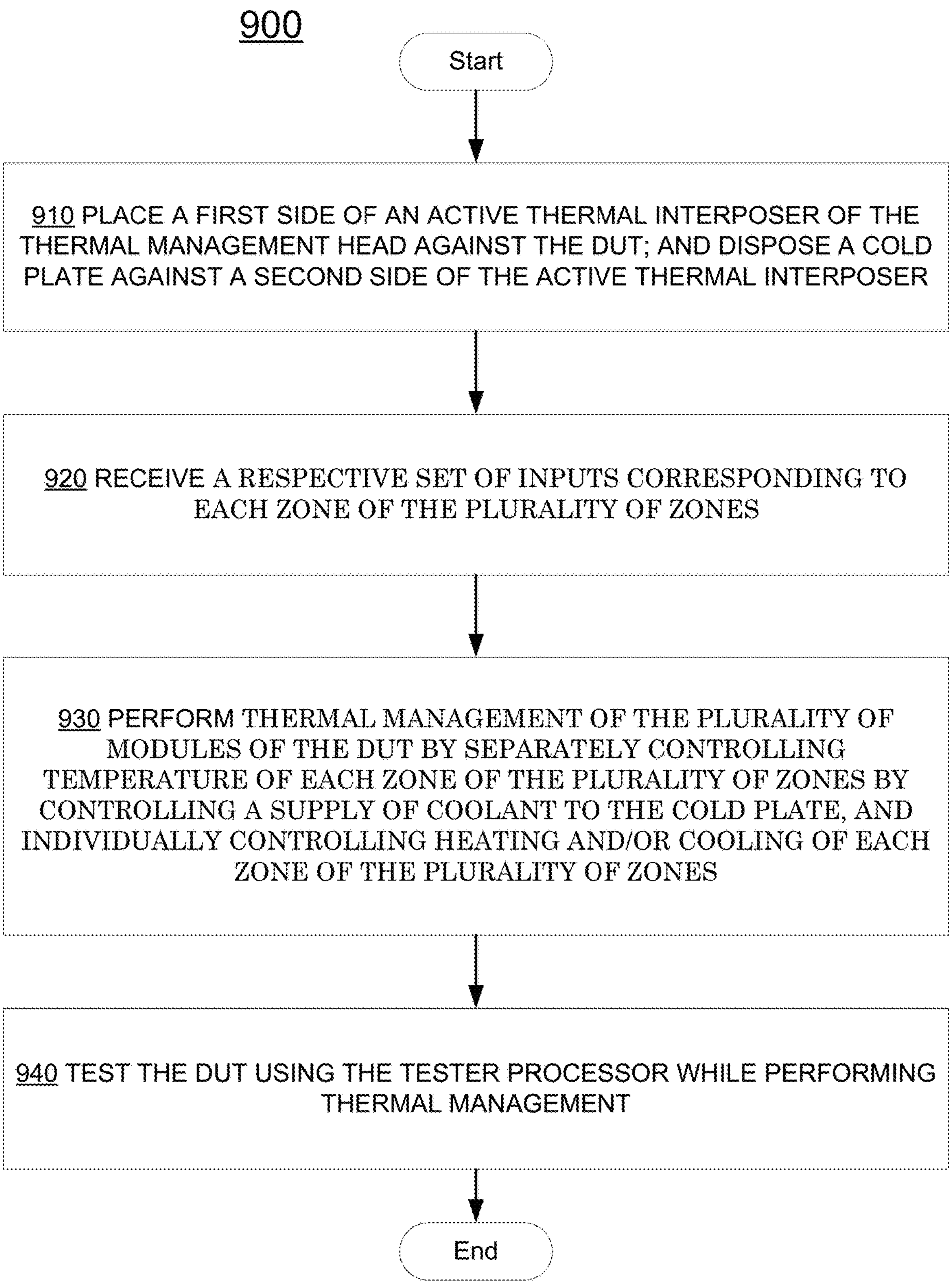
FIG. 9 illustrates an exemplary computer-controlled method for performing thermal management of a device under test, in accordance with embodiments of the present invention.

FIG. 9 illustrates an exemplary computer-controlled method 900 for performing thermal management of a device under test, in accordance with embodiments of the present invention. In some embodiments, method 900 is operable in a tester system comprising a thermal management head, e.g., active thermal interposer device 120 as described in FIG. 1, and an automatic thermal control system, e.g., automatic thermal control system 800 as described with respect to FIG. 8. In some embodiments, the device under test may be a multi-chip module (MCM) and/or a system in a package (SIP).

In 910, a first side of an active thermal interposer device, e.g., active thermal interposer device 120 (FIG. 1), of the thermal management head is placed on the DUT, and a cold plate, e.g., cold plate 130 (FIG. 1) is placed on a second side of the active thermal interposer device. The DUT may comprise a plurality of modules, e.g., different integrated circuits and/or integrated circuit packages, e.g., zone 1 712, zone 2 714, zone 3 716 of FIG. 7. The active thermal interposer device may comprise a plurality of zones. Each zone of the plurality of zones of the active thermal interposer device corresponds to a respective module of the plurality of modules of the DUT, and is operable to be selectively heated. For example, a first zone of the active thermal interposer device may be heated while a second zone of the active thermal interposer device is not heated, or is heated to a different amount of added heat. One or more of the zones of the active thermal interposer device may optionally be selectively cooled.

In 920, a respective set of inputs corresponding to each zone of the plurality of zones of the thermal interposer device is received by the tester system, e.g., automatic thermal control system 800 (FIG. 8). The inputs may include, for example, one or more of a temperature of the cold plate, and/or a temperature of the zone of the active thermal interposer device. Additional information received by the tester system may include a case temperature, a junction temperature of a die of a module corresponding to the zone, an amount of power supplied to the module corresponding to the zone, and/or a current position within a predetermined thermal control profile of the module corresponding to the zone. The amount of power may include power supplied from a plurality of power supplies respectively coupled to the plurality of modules within a device under test.

In 930, thermal management of the plurality of modules of the DUT is performed. A temperature of each zone of the plurality of zones of the active thermal interposer device is separately controlled by multiple operations, based on a variety of zone and/or module specific information. In one operation, a supply of coolant to the cold plate is controlled. For example, automatic thermal control system 800 (FIG. 8) may receive a temperature 738 (FIG. 7) of cold plate 730. Responsive to the temperature 738 of the cold plate 730, and in consideration of a temperature of each zone of the plurality of zones of the active thermal interposer device, automatic thermal control system 800 (FIG. 8) may control valve 754 (FIG. 7) to increase or decrease the cooling capacity of cold plate 730.

Each zone of the plurality of zones of the active thermal interposer device is further controlled (742 of FIG. 7) by individually controlling heating and/or cooling of each zone of the plurality of zones of the active thermal interposer device. For example, temperature 728 (FIG. 7) of each zone (zone 1, zone 2, zone 3) of the plurality of zones of the active thermal interposer is received by automatic thermal control system 800 (FIG. 8). Automatic thermal control system 800 (FIG. 8) may also receive module temperature-related information, e.g., junction temperature, case temperature, power consumption, and/or pre-trigger information from modules of the device under test, e.g., DUT Zone 1 712, Zone 2 714, and/or Zone 3 716 (FIG. 7). Thus, the automatic thermal control system 800 (FIG. 8) may receive temperature information, and other temperature-related information, from modules of the device under test as well as from temperature zones of the active thermal interposer device corresponding to such modules of the device under test.

The thermal management of the device under test is further implemented by a plurality of thermal processes, wherein each thermal process controls a temperature of a respective zone of the plurality of zones of the active thermal interposer device based on a respective set of inputs for the respective zone of the active thermal interposer device and/or module of the device under test.

The thermal management may include implementing power following heuristics within a respective thermal process, of the plurality of thermal processes, which utilizes inputs pertaining to an amount of power supplied to a module corresponding to a zone regulated by said respective thermal process, in some embodiments.

In some embodiments, the thermal management may include pre-trigger heuristics within a respective thermal process, of the plurality of thermal processes, which utilizes inputs pertaining to amount of work expected to be performed by a module corresponding to a zone regulated by said respective thermal process.

In optional 940, the device under test is tested using the tester processor. For example, a series of test patterns may stimulate the device under test, and resulting outputs are observed. Thermal management of the plurality of modules of the DUT is performed contemporaneously with the testing.

Figure 10:
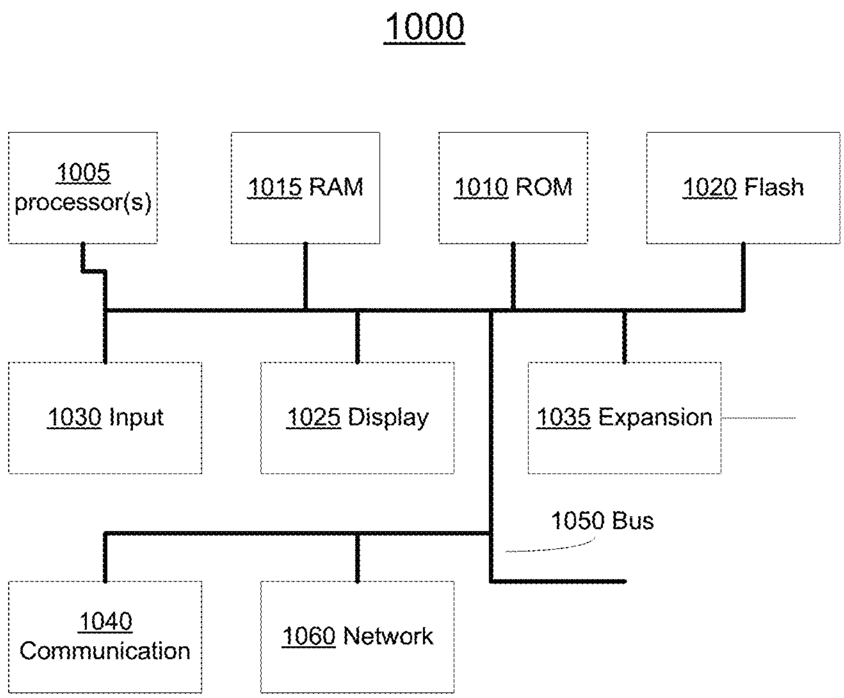
FIG. 10 illustrates a block diagram of an exemplary electronic system, which may be used as a platform to implement and/or as a control system for embodiments of the present invention.

FIG. 10 illustrates a block diagram of an exemplary electronic system 1000, which may be used as a platform to implement and/or as a control system for embodiments of the present invention. For example, automatic thermal control system 800 (FIG. 8) may comprise electronic system 1000. For example, system 1000 may implement and/or control some or all elements of process 600 (FIG. 6) and/or process 900 (FIG. 9). Electronic system 1000 may be a "server" computer system, in some embodiments. Electronic system 1000 includes an address/data bus 1050 for communicating information, a central processor complex 1005 functionally coupled with the bus for processing information and instructions. Bus 1050 may comprise, for example, a Peripheral Component Interconnect Express (PCIe) computer expansion bus, industry standard architecture (ISA), extended ISA (EISA), MicroChannel, Multibus, IEEE 796, IEEE 1196, IEEE 1496, PCI, Computer Automated Measurement and Control (CAMAC), MBus, Runway bus, Compute Express Link (CXL), and the like.

Central processor complex 1005 may comprise a single processor or multiple processors, e.g., a multi-core processor, or multiple separate processors, in some embodiments. Central processor complex 1005 may comprise various types of well known processors in any combination, including, for example, digital signal processors (DSP), graphics processors (GPU), complex instruction set (CISC) processors, reduced instruction set (RISC) processors, and/or very long word instruction set (VLIW) processors. Electronic system 1000 may also includes a volatile memory 1015 (e.g., random access memory RAM) coupled with the bus 1050 for storing information and instructions for the central processor complex 1005, and a non-volatile memory 1010 (e.g., read only memory ROM) coupled with the bus 1050 for storing static information and instructions for the processor complex 1005. Electronic system 1000 also optionally includes a changeable, non-volatile memory 1020 (e.g., NOR flash) for storing information and instructions for the central processor complex 1005 which can be updated after the manufacture of system 1000. In some embodiments, only one of ROM 1010 or Flash 1020 may be present.

Also included in electronic system 1000 of FIG. 10 is an optional input device 1030. Device 1030 can communicate information and command selections to the central processor 1000. Input device 1030 may be any suitable device for communicating information and/or commands to the electronic system 1000. For example, input device 1030 may take the form of a keyboard, buttons, a joystick, a track ball, an audio transducer, e.g., a microphone, a touch sensitive digitizer panel, eyeball scanner, and/or the like.

Electronic system 1000 may comprise a display unit 1025. Display unit 1025 may comprise a liquid crystal display (LCD) device, cathode ray tube (CRT), field emission device (FED, also called flat panel CRT), light emitting diode (LED), plasma display device, electro-luminescent display, electronic paper, electronic ink (e-ink) or other display device suitable for creating graphic images and/or alphanumeric characters recognizable to the user. Display unit 1025 may have an associated lighting device, in some embodiments.

Electronic system 1000 also optionally includes an expansion interface 1035 coupled with the bus 1050. Expansion interface 1035 can implement many well known standard expansion interfaces, including without limitation the Secure Digital Card interface, universal serial bus (USB) interface, Compact Flash, Personal Computer (PC) Card interface, CardBus, Peripheral Component Interconnect (PCI) interface, Peripheral Component Interconnect Express (PCI Express), mini-PCI interface, IEEE 10394, Small Computer System Interface (SCSI), Personal Computer Memory Card International Association (PCMCIA) interface, Industry Standard Architecture (ISA) interface, RS-232 interface, and/or the like. In some embodiments of the present invention, expansion interface 1035 may comprise signals substantially compliant with the signals of bus 1050.

A wide variety of well-known devices may be attached to electronic system 1000 via the bus 1050 and/or expansion interface 1035. Examples of such devices include without limitation rotating magnetic memory devices, flash memory devices, digital cameras, wireless communication modules, digital audio players, and Global Positioning System (GPS) devices.

System 1000 also optionally includes a communication port 1040. Communication port 1040 may be implemented as part of expansion interface 1035. When implemented as a separate interface, communication port 1040 may typically be used to exchange information with other devices via communication-oriented data transfer protocols. Examples of communication ports include without limitation RS-232 ports, universal asynchronous receiver transmitters (UARTs), USB ports, infrared light transceivers, ethernet ports, IEEE 10394, and synchronous ports.

System 1000 optionally includes a network interface 1060, which may implement a wired or wireless network interface. Electronic system 1000 may comprise additional software and/or hardware features (not shown) in some embodiments.

Various modules of system 1000 may access computer readable media, and the term is known or understood to include removable media, for example, Secure Digital ("SD") cards, CD, DVD ROMs, and/or Blu-Ray ROM s, diskettes and the like, as well as non-removable or internal media, for example, hard drives, solid state drive s (SSD), RAM, ROM, flash, and the like.

Embodiments in accordance with the present invention provide systems and methods for multi-input multi-zone thermal control. In addition, embodiments in accordance with the present invention provide systems and methods for multi-input multi-zone thermal control operable to control different portions of a device under test to different temperatures. Further, embodiments in accordance with the present invention provide systems and methods for multi-input multi-zone thermal control operable to control different portions of a device under test at different heights to different temperatures based on different temperature inputs. Still further, embodiments in accordance with the present invention provide systems and methods for multi-input multi-zone thermal control that are compatible and complementary with existing systems and methods of testing integrated circuits.

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

We claim:

1. In a tester system comprising a thermal management head and a test processor, a method of performing thermal management for an integrated circuit device under test ("DUT"), wherein said DUT comprises at least one integrated circuit singulated from a wafer, the method comprising:

disposing an active thermal interposer device adjacent to a cold plate of said thermal management head;

disposing said DUT on said active thermal interposer device, wherein said DUT comprises a singulated die and wherein said active thermal interposer device comprises a plurality of zones, each zone of said plurality of zones operable to be selectively heated;

receiving a respective set of inputs, wherein at least one input of said set of inputs corresponds to a temperature of said die;

testing said singulated die using said test processor; and concurrently with said testing, performing a thermal management process with respect to said singulated die by: 1) controlling cooling to said cold plate; and 2) controlling heating of said plurality of zones of said active thermal interposer device.

2. The method of claim 1 wherein said disposing said DUT on said active thermal interposer device comprises:

automatically disposing said DUT on a surface of said active thermal interposer device; and automatically aligning a position of said DUT with respect to a location on said surface of said active thermal interposer device.

3. The method of claim 1 wherein said performing said thermal management process comprises performing a plurality of thermal processes to control respective temperatures of said plurality of zones.

4. The method of claim 1 wherein said thermal management process is responsive to said set of inputs and wherein said set of inputs further comprise:

an input corresponding to a temperature of said cold plate;

an input corresponding to a junction temperature with respect to said singulated die; and an input corresponding to an amount of power supplied to said die during said testing.

5. The method of claim 1 wherein said singulated die comprises multiple functional units.

6. The method of claim 3 wherein said performing a thermal management process further comprises implementing power following heuristics within a respective thermal process, of said plurality of thermal processes, that utilizes inputs, of said set of inputs, pertaining to an amount of power supplied to said singulated die during said testing thereof.

7. The method of claim 3 wherein said performing a thermal management process further comprises implementing pre-trigger heuristics within a respective thermal process, of said plurality of thermal processes, that utilizes inputs, of said set of inputs, pertaining to amount of work expected to be performed by said singulated die during said testing thereof.

8. The method of claim 1 wherein said active thermal interposer device is a discrete component and wherein further positions of said plurality of zones of said active thermal interposer device are customized for a layout of said singulated die.

9. In a tester system comprising a thermal management head and a test processor, a method of testing an integrated circuit device under test ("DUT"), the method comprising:

disposing an active thermal interposer (ATI) onto a surface of a cold plate of said thermal management head, wherein a first surface of said ATI is adjacent to said surface of said cold plate and wherein said ATI comprises a plurality of zones operable to be selectively heated;

disposing said DUT onto a second surface of said ATI, different from said first surface, and wherein said DUT comprises a singulated die;

testing said DUT by said test processor; and concurrently with said testing, performing thermal management of said DUT based on a set of inputs, wherein said performing thermal management comprises:

cooling said cold plate; and individually heating said plurality of zones of said ATI.

10. The method of claim 9 wherein said set of inputs comprise:

an input corresponding to a temperature of said cold plate;

an input corresponding to a junction temperature with respect to said singulated die; and an input corresponding to an amount of power supplied to said singulated die during said testing.

11. The method of claim 9 wherein said singulated die comprises multiple functional units.

12. The method of claim 9 wherein said performing thermal management further comprises implementing power following heuristics that utilize inputs, of said set of inputs, pertaining to an amount of power supplied to said singulated die during said testing thereof.

13. The method of claim 9 wherein said performing thermal management further comprises implementing pre-trigger heuristics that utilize inputs, of said set of inputs, pertaining to amount of work expected to be performed by said singulated die during said testing thereof.

14. The method of claim 9 wherein said ATI is a discrete component and wherein further said plurality of zones of said ATI are customized to a layout of said singulated die.

15. A test system for testing integrated circuits, said test system comprising:

a thermal management head comprising a cold plate;

a test computer operable to perform testing on an integrated circuit device under test ("DUT"), wherein said DUT comprises a singulated die;

an automated pick and place system operable to:

pick said DUT from a DUT tray;

place an active thermal interposer (ATI) onto said DUT;

move said DUT to a test management head; and dispose said DUT onto a surface of said cold plate of said thermal management head, wherein said ATI comprises a plurality of zones operable to be selectively heated, wherein said thermal management head further comprises components for performing thermal management of said DUT concurrently with said testing and based on a set of inputs, wherein said performing thermal management comprises:

cooling said cold plate; and individually heating said plurality of zones of said ATI.

16. The test system of claim 15 wherein said set of inputs comprise:

an input corresponding to a temperature of said cold plate;

an input corresponding to a junction temperature with respect to said singulated die; and an input corresponding to an amount of power supplied to said singulated die during said testing.

17. The test system of claim 15 wherein said singulated die comprises multiple functional units.

18. The test system of claim 15 wherein said performing thermal management further comprises implementing power following heuristics that utilize inputs, of said set of inputs, pertaining to an amount of power supplied to said singulated die during said testing thereof.

19. The test system of claim 15 wherein said performing thermal management further comprises implementing pre-trigger heuristics that utilize inputs, of said set of inputs, pertaining to amount of work expected to be performed by said singulated die during said testing thereof.

20. The test system of claim 15 wherein said ATI is a discrete component and wherein further said plurality of zones of said ATI are customized to a layout of said singulated die.

* * * * *